(12) United States Patent
Pelley et al.

(10) Patent No.: US 9,779,807 B2
(45) Date of Patent: *Oct. 3, 2017

(54) NON-VOLATILE MEMORY USING BI-DIRECTIONAL RESISTIVE ELEMENTS

(71) Applicant: FREESCALE SEMICONDUCTOR, INC., Austin, TX (US)

(72) Inventors: Perry H. Pelley, Austin, TX (US); Frank K. Baker, Jr., Austin, TX (US)

(73) Assignee: NXP USA, Inc., Austin, TX (US)

( * ) Notice: Subject to any disclaimer, the term of this patent is extended or adjusted under 35 U.S.C. 154(b) by 208 days.

This patent is subject to a terminal disclaimer.

(21) Appl. No.: 14/448,174

(22) Filed: Jul. 31, 2014

(65) Prior Publication Data

US 2016/0035415 A1 Feb. 4, 2016

(51) Int. Cl.
*G11C 5/06* (2006.01)
*G11C 13/00* (2006.01)
*G11C 8/14* (2006.01)

(52) U.S. Cl.
CPC .............. *G11C 13/004* (2013.01); *G11C 8/14* (2013.01); *G11C 13/003* (2013.01); *G11C 13/0028* (2013.01); *G11C 13/0069* (2013.01); *G11C 2013/0071* (2013.01); *G11C 2213/74* (2013.01); *G11C 2213/79* (2013.01); *G11C 2213/82* (2013.01)

(58) Field of Classification Search
USPC ......................................................... 365/72
See application file for complete search history.

(56) References Cited

U.S. PATENT DOCUMENTS

| 4,809,225 | A | | 2/1989 | Dimmler et al. |
| 4,980,859 | A | | 12/1990 | Guterman et al. |
| 5,541,883 | A | | 7/1996 | Devanney |
| 5,594,833 | A | | 1/1997 | Miyazawa |
| 5,880,997 | A | * | 3/1999 | Hawkins .................. G11C 8/16 365/189.05 |
| 6,529,973 | B1 | | 3/2003 | Spaur |
| 6,980,459 | B2 | | 12/2005 | Seshadri et al. |
| 7,079,415 | B2 | | 7/2006 | Frey |
| 7,197,607 | B2 | | 3/2007 | Roohparvar |

(Continued)

FOREIGN PATENT DOCUMENTS

| JP | 60144977 A | 7/1985 |
| JP | 2002109875 A | 4/2002 |

(Continued)

OTHER PUBLICATIONS

Abe, K., et al., "Novel Hybrid DRAM/MRAM Design for Reducing Power of High Performance Mobile CPU", IEEE International Electron Devices Meeting (IEDM), pp. 10.5.1-10.5.4, Dec. 10-13, 2012.

(Continued)

*Primary Examiner* — James G Norman

(57) ABSTRACT

A memory cell includes a single bi-directional resistive memory element (BRME) having a first terminal directly connected to a first power rail and a second terminal coupled to an internal node; and a first transistor having a control electrode coupled to the internal node, and a first current electrode coupled to a first bitline, and a second current electrode coupled to one of a group consisting of: a read wordline and the first power rail.

16 Claims, 5 Drawing Sheets

(56) References Cited

U.S. PATENT DOCUMENTS

| | | | | |
|---|---|---|---|---|
| 8,331,134 B2* | 12/2012 | Chiu | ............... | G11C 13/0002 365/154 |
| 8,638,599 B2* | 1/2014 | Akiyama | ............ | G11C 11/1673 365/149 |
| 9,281,042 B1* | 3/2016 | Pelley | ............... | G11C 13/0002 |
| 2004/0120200 A1* | 6/2004 | Gogl | ............... | G11C 7/067 365/210.1 |
| 2007/0058424 A1* | 3/2007 | Inaba | ............... | G11C 11/16 365/158 |
| 2008/0084736 A1* | 4/2008 | Lee | ............... | G11C 8/16 365/163 |
| 2008/0094874 A1* | 4/2008 | Liaw | ............... | G11C 11/16 365/148 |
| 2009/0086530 A1* | 4/2009 | Chung | ............... | G11C 11/16 365/158 |
| 2009/0129139 A1* | 5/2009 | Kam | ............... | G11C 23/00 365/129 |
| 2010/0315862 A1* | 12/2010 | Huang | ............... | G11C 11/419 365/156 |
| 2011/0317468 A1* | 12/2011 | Terzioglu | ............... | G11C 17/18 365/96 |
| 2012/0075910 A1* | 3/2012 | Yasuda | ............... | G11C 13/0004 365/148 |
| 2013/0027079 A1* | 1/2013 | Nazarian | ............... | H01L 27/101 326/41 |
| 2015/0318024 A1* | 11/2015 | Baker, Jr. | ............... | G11C 13/0069 365/72 |
| 2015/0348595 A1* | 12/2015 | Baker, Jr. | ............... | G11C 5/06 365/72 |

FOREIGN PATENT DOCUMENTS

| | | |
|---|---|---|
| JP | 2011081896 A | 4/2011 |
| KR | 20020002823 A | 1/2002 |

OTHER PUBLICATIONS

Ohsawa, T., et al., "1Mb 4T-2MTJ Nonvolatile STT-RAM for Embedded Memories Using 32b Fine-Grained Power Gating Technique with 1.0ns/200ps Wake-up/Power-off Times", 2012 Symposium on VLSI Circuits Digest of Technical Papers, Jun. 2012, pp. 46-47.

* cited by examiner

NON-VOLATILE MEMORY USING BI-DIRECTIONAL RESISTIVE ELEMENTS

BACKGROUND

Field of the Disclosure

The present disclosure relates in general to non-volatile memories, and more specifically to systems and methods for non-volatile memory that use bi-directional resistive elements.

Description of the Related Art

Memories with resistive storage elements are under development across the semiconductor industry that are geared to replace conventional random access memory (RAM) and non-volatile memory devices. The resistive memory devices include magnetoresistive random access memory (MRAM), Resistive random-access memory (RRAM or ReRAM), phase-change memory (PCM), among others. Most of the resistive memory devices are implemented in one transistor/one resistive element or one diode/one resistive element memory cell configurations, which provide minimal cell area but exhibit relatively slow read and write performance (e.g., approximately 30 nanoseconds or more per operation). Thus, resistive memory devices are not a viable substitute for much of the static RAM in a higher performance system where read/write operations occur within a few clock cycles. It is also difficult to produce a reliable one transistor/one resistive element or one diode/one resistive element memory.

Memory cells with one transistor and one resistive element may eventually replace embedded flash on future SoCs, but it is desirable to use these same elements to replace the static random access memory (SRAM) as well. Potentially, less flash would be needed, or the system could use a more efficient architecture, if the 'fast' memory such as SRAM was also compact and non-volatile.

BRIEF DESCRIPTION OF THE DRAWINGS

The benefits, features, and advantages of the present disclosure will become better understood with regard to the following description, and accompanying drawings where.

DETAILED DESCRIPTION

Integrated circuit devices and methods are disclosed that utilize resistive storage elements operating bi-directionally as non-volatile storage with read speeds and space requirements comparable to conventional six transistor SRAM. A bi-directional resistive element can be changed between a high resistive state (HRS) and a low resistive state (LRS), and the state of the resistive element produces a robust zero or one logic state to be sensed. The memory cells include a resistive element coupled between an internal node and a column-wise power supply (VSSC). The resistive element can be 'programmed' to HRS or to LRS, depending on the desired logic state to be stored. The cells also include a write transistor coupled between a bitline and the internal node and controlled by a write wordline, and a two-transistor read circuit actuated by a read wordline, coupling the read circuit to the bitline. The write transistor is used to provide a voltage or a current to program the resistive element to a HRS or a LRS for a write operation and to precharge the internal node in preparation for a read operation. The two-transistor read circuit either does or does not discharge the bit line, based on the state of the resistive element.

Figure 1:
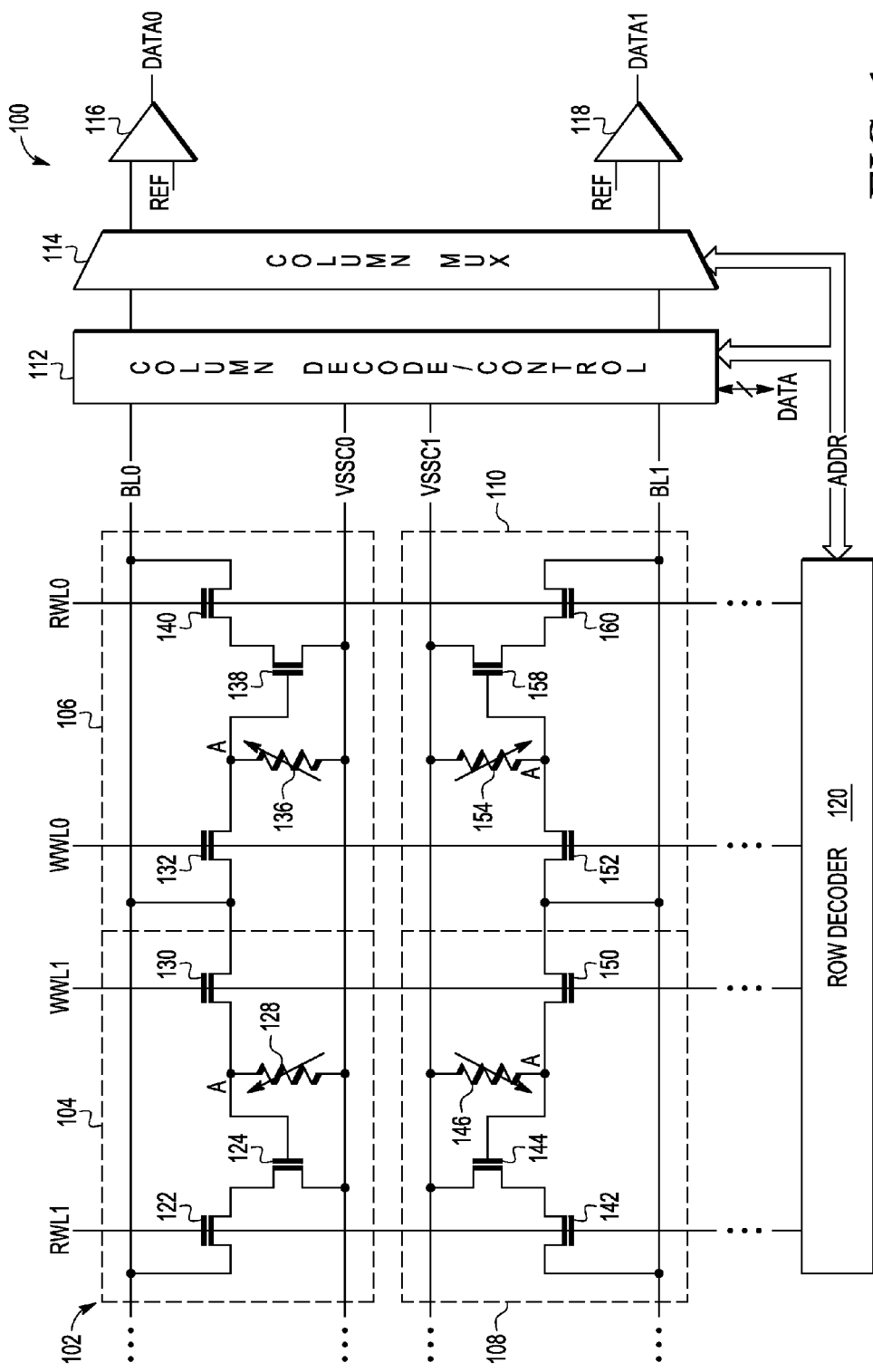
FIG. 1 is a schematic diagram of an integrated circuit device including a single port non-volatile memory (NVM) according to one embodiment.

FIG. 1 is a block diagram of an integrated circuit device including a non-volatile memory (NVM) device 100 according to one embodiment. NVM device 100 includes NVM array 102 with a plurality of memory cells 104, 106, 108, 110 coupled to column decode/control 112, column multiplexer 114, sense amplifiers 116, 118, and row decoder 120. Sense amplifiers 116, 118 are coupled to column decode/control 112 by column multiplexer 114. Row decoder 120, column decode/control 112, and column multiplexer 114 can receive addresses for read and write requests from a data processor (not shown). Data to be written to memory array 102 is provided from a processor to column decode/control 112. Read wordlines $RWL_{0-1}$ and write wordlines $WWL_{0-1}$ are coupled between row decoder 120 and memory array 102. Although device 100 is shown with four memory cells 104-110, two read and write wordlines and two bitlines, device 100 can include any suitable number of memory cells, wordlines and bitlines.

Data is written into or read from the NVM array 102 via column decode/control 112. Bitlines $BL_{0-1}$ are coupled between memory array 102 and sense amplifiers 116, 118 by way of column multiplexer 114. Sense amplifiers 116, 118 provide data from memory array 106 to one or more processors.

NVM device 100 may be implemented as part of a System On Chip (SOC) or the like which includes at least one processor coupled to the NVM device 100 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternative embodiment, the NVM device 100 is implemented alone in an integrated circuit without any other devices. In another alternative embodiment, NVM device 100 is part of a larger system on the integrated circuit.

Memory cell 104 includes first and second N-channel access transistors 122, 130, a data storing bidirectional resistive element 128 and N-channel discharge or pull-down transistor 124. Access transistor 122 has a first current electrode coupled to bitline BL0, a second current electrode coupled to a first current electrode of pull-down transistor 124, and a control electrode coupled to read wordline RWL1. Access transistor 130 has a first current electrode coupled to bitline BL0, a second current electrode coupled to internal node A (also referred to as a data storage node), and a control electrode coupled to write wordline WWL1.

Pull-down transistor 124 has a second current electrode coupled to voltage supply VSSC0 (also referred to herein as a power rail), and a control electrode coupled to internal node A. Resistive element 128 has a cathode terminal coupled to internal node A and an anode terminal coupled to voltage supply VSSC0.

Memory cell 106 includes first and second N-channel access transistors 132, 140, a data storage bidirectional resistive element 136 and N-channel discharge or pull-down transistor 138. Access transistor 132 has a first current electrode coupled to bitline BL0, a second current electrode coupled to internal node A, and a control electrode coupled to write wordline WWL0. Access transistor 140 has a first current electrode coupled to bitline BL0, a second current electrode coupled to a first current electrode of pull-down transistor 138, and a control electrode coupled to read wordline RWL0. Discharge or pull-down transistor 138 a second current electrode coupled to power supply VSSC0, and a control electrode coupled to internal node A. Resistive element 136 has a cathode terminal coupled to internal node A and an anode terminal coupled to voltage supply VSSC0.

Memory cell 108 includes first and second N-channel access transistors 142, 150, a data storing bidirectional resistive element 146 and N-channel discharge or pull-down transistor 144. Access transistor 142 has a first current electrode coupled to bitline BL1, a second current electrode coupled to a first current electrode of pull-down transistor 144, and a control electrode coupled to read wordline RWL1. Access transistor 150 has a first current electrode coupled to bitline BL1, a second current electrode coupled to internal node A, and a control electrode coupled to write wordline WWL1. Discharge transistor 144 has a second current electrode coupled to voltage supply VSSC1, and a control electrode coupled to internal node A. Resistive element 146 has a cathode terminal coupled to internal node A and an anode terminal coupled to voltage supply VSSC1.

Memory cell 110 includes first and second N-channel access transistors 152, 160, a data storing bidirectional resistive element 154 and N-channel discharge or pull-down transistor 158. Access transistor 152 has a first current electrode coupled to bitline BL1, a second current electrode coupled to internal node A, and a control electrode coupled to write wordline WWL0. Access transistor 160 has a first current electrode coupled to bitline BL1, a second current electrode coupled to a first current electrode of pull-down transistor 158, and a control electrode coupled to read wordline RWL0. Discharge or pull-down transistor 158 has a second current electrode coupled to power supply VSSC1, and a control electrode coupled to internal node A. Resistive element 154 has a cathode terminal coupled to internal node A and an anode terminal coupled to voltage supply VSSC1.

Note that in the illustrated embodiment, in each cell, the second current electrode of the pull-down transistor (e.g. transistors 124, 138, 144, and 158) is directly connected to the VSS power voltage supply (VSSC0 or VSSC1).

Bi-directional resistive elements 128, 136, 146 and 154 are used as nonvolatile storage for the data in memory cells 104-110. The anode of resistive elements 128, 136, 146, 154 is connected to a respective one of voltage supply VSSC0, VSSC1, and the cathode of resistive elements 128, 136, 146, and 154 is coupled to a respective internal node A. When reading a resistive element, the resistive element will be detected to be in a high resistive state (HRS) or a low resistive state (LRS). To write resistive element 128, 136, 146, or 154 to a HRS, the anode is taken positive relative to the cathode by applying a positive bias to VSSC and pulling the internal node A low through access transistor 130, 140, 150, or 160, respectively. To write resistive element 128, 136, 146, or 154 to a LRS, the cathode is taken positive relative to the anode by applying a negative bias to VSSC and coupling the internal node A to a positive voltage through access transistor 130, 140, 150, or 160, respectively. As used herein, it is assumed that if the resistive element of a memory cell is in a HRS, the memory cell stores a logic level "0" and if in a LRS, the memory cell stores a logic level "1". However, alternatively, the LRS may correspond to storing a logic level "0" and the HRS to storing a logic level "1". Other embodiments may reverse the orientation of the anode and cathode for the resistive elements, and the biases applied for writing to HRS and LRS would be adjusted accordingly.

Figure 2:
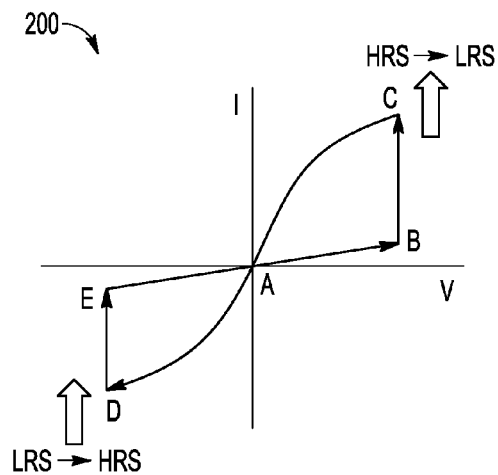
FIG. 2 is a diagram showing states of a resistive element of a memory cell in the memory array of FIG. 1 in accordance with one embodiment.

FIG. 2 is a diagram showing states of a resistive element, for example resistive element 128, of memory cell 104 in the memory array 102 of FIG. 1 in accordance with one embodiment. In state A, the current and voltage are approximately zero, and the resistance is in a high resistive state (HRS). As voltage increases along the positive x-axis, the current remains low until the voltage reaches a level at state B that causes the resistive element 128 to shift from a HRS to a low resistive state (LRS) at state C. With resistive element 128 in LRS, current varies monotonically with voltage and may not be linearly proportional. In the diagram shown, as voltage decreases to a negative value at state D, current has also decreased to a negative value. At state D, the voltage and current reach a level that causes resistive element 128 to change from a LRS to HRS, shown as state E in FIG. 2. With resistive element 128 in the HRS, current barely changes with increases in voltage, as shown with current remaining close to zero along the y-axis as voltage varies from a lowest to a highest value from state E to state A, and from state A to state B.

Figure 3:
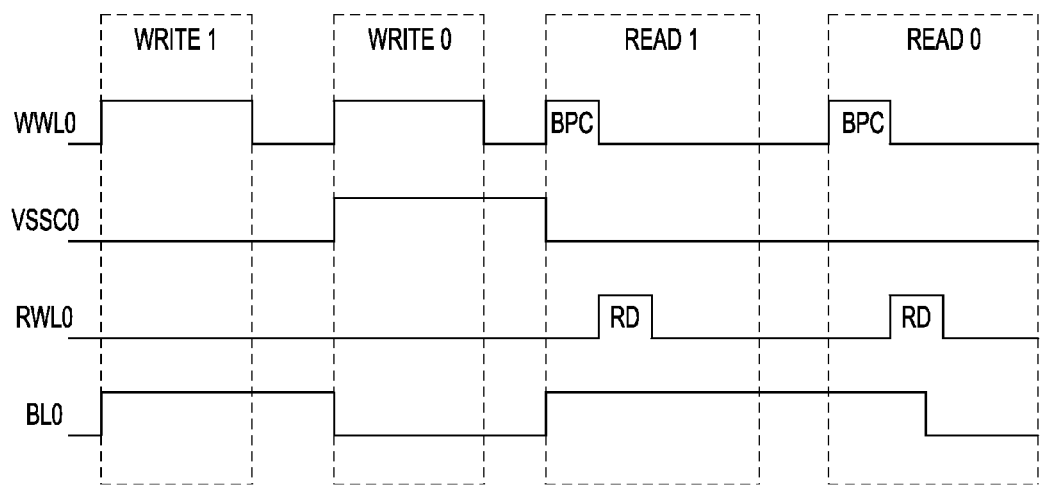
FIG. 3 is a timing diagram showing states of signals in a memory cell that may be used in the memory array of FIG. 1 during write, pre-charge and read operations in accordance with one embodiment.

FIG. 3 is a timing diagram showing states of signals in a memory cell that may be used in the memory array of FIG. 1 during write, pre-charge and read operations in accordance with one embodiment. Note that while write "1", write"0", read "1", and read "0" states are shown as starting immediately after the previous state ends, it is likely some time will pass between states and the various signals VSSC0, BL0, WWL0, and RWL0 may take different intermediate values during time intervals between states that are not shown in FIG. 3.

Referring to FIGS. 1 and 3, to write a "1" in a selected memory cell 106, FIG. 3 shows the bitline (BL0) is taken to a high voltage, for example, 2 Volts. Write wordline WWL0 is turned on, and VSSC0 is grounded. This results in a current flowing down from internal node A through resistive element 136 to VSSC0, thus switching resistive element 136 from HRS to LRS.

To write a "0" in a selected memory cell 106, bitline BL0 is taken low, for example, 0 Volts. Write wordline WWL0 is turned on, and VSSC0 is taken to supply voltage, for example, 2 Volts. This results in a current flowing up from VSSC0 through resistive element 136 to internal node A, which switches resistive element 136 from LRS to HRS. The data storage state is determined by the state (HRS or LRS) of resistive element 136. Typically, HRS is about two to more than ten times higher than LRS. Therefore, for a write of the two different logic states, current is provided through resistive element 136 is opposite directions. That is, current in a first direction results in a logic level "1" being stored and current in a second and opposite direction results in a logic level "0".

To read memory cell 106, VSSC0 is set to zero Volts, and internal node A is precharged through transistor 132. For the precharge portion (labeled BPC) of the read operation, write wordline WWL0 and BL0 are asserted to logic level highs (for example, two volts) to provide current from BL0 to internal node A which precharges node A to a logic level high. After the precharge is complete, WWL0 is deasserted thus turning off transistor 132. In order to perform the read, bitline BL0 is precharged to a positive voltage and read word line RWL0 is asserted. When RWL0 is asserted, based on the resistive state of resistive element 136, node A will discharge slowly (corresponding to the HRS) or very quickly (corresponding to the LRS), and as a result, transistor 138 will discharge bitline BL0 by a large amount (HRS) or a small amount (LRS).

For example, in the case that a "1" is stored in memory cell 106 (corresponding to resistive element 136 being in a LRS), upon turning on transistor 140 by asserting RWL0, the low resistance of resistive element 136 quickly pulls the control electrode of transistor 138 low, thus turning off transistor 138 before BL0 can discharge so that BL0 remains at a relatively high voltage. This will be sensed by sense amplifier 116 to determine that a "1" is stored in memory cell 106.

In the case that a "0" is stored in memory cell 106 (corresponding to resistive element 136 being in a HRS), upon turning on transistor 140 by asserting RWL0, the high resistance of resistive element 136 draws relatively little current and thus the control electrode of transistor 138 discharges slowly from the precharged voltage. Therefore, transistor 138 remains on and discharges BL0 which pulls BL0 to a relatively low voltage, as illustrated in FIG. 3. This will be sensed by sense amplifier 116 to determine that a "0" is stored in memory cell 106.

Figure 4:
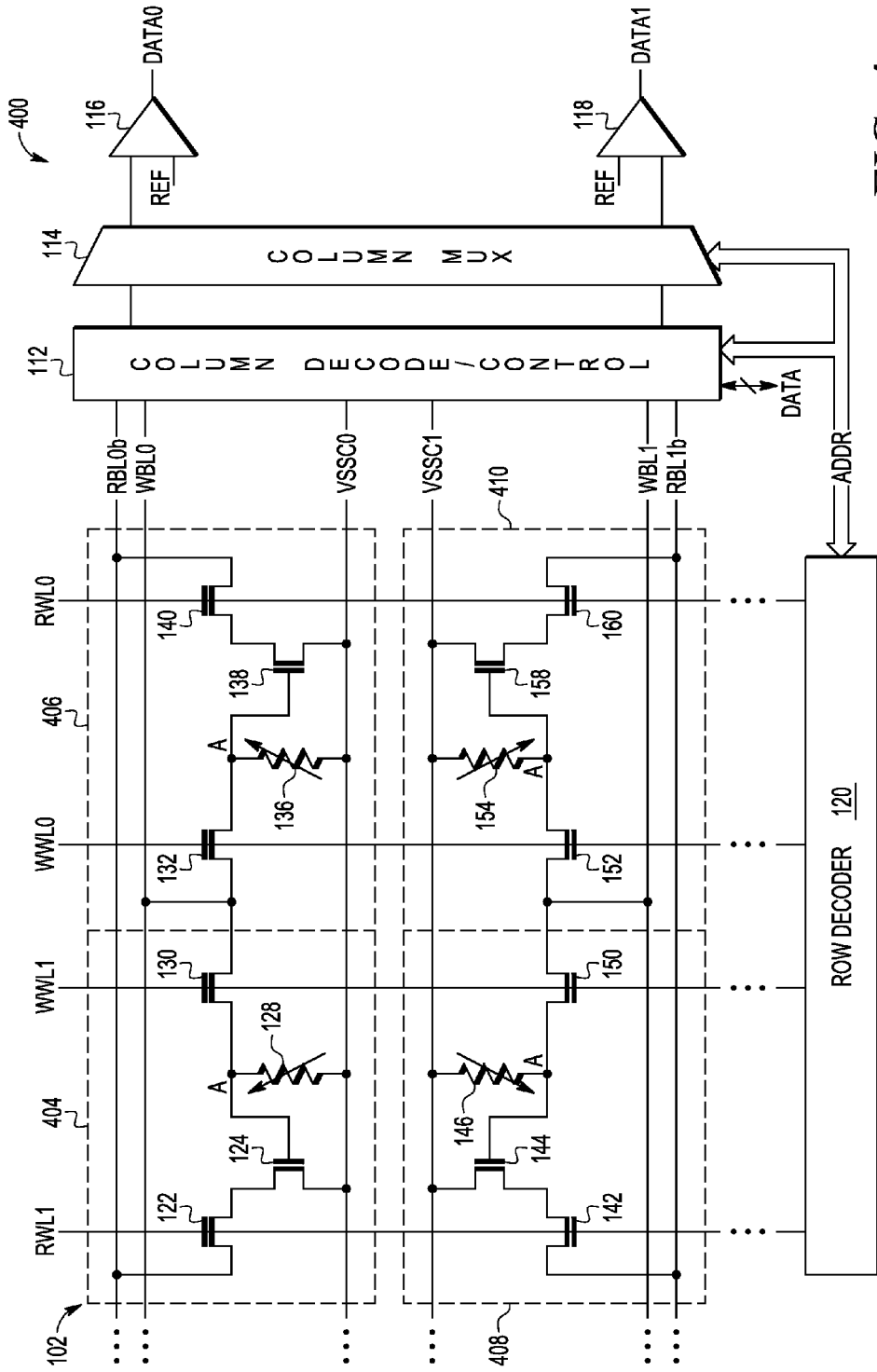
FIG. 4 is a schematic diagram of an integrated circuit device including a dual port non-volatile memory (NVM) according to another embodiment.

FIG. 4 is a schematic diagram of a dual port integrated circuit or memory device 400 which is shown with memory cells 404-410 having a structure and function that is similar to memory cells 104-110 shown in and described for FIG. 1 with the exception that memory cells 104, 106, 108, 110 are coupled to respective read bitlines (RBL0b, RBL1b) and write bitlines (WBL0, WBL1) instead of just one respective bitline (BL0, BL1) as shown in FIG. 1. (Note that the "b" following a signal name denotes the complement of the signal.) In particular, the first current electrodes of transistors 130, 132 are coupled to the first write bitline WBL0b, and the first current electrodes of transistors 150, 152 are coupled to a second write bitline WBL1b. The first current electrodes of transistors 122, 140 are coupled to a first read bitline RBL0b, and the first current electrodes of transistors 142, 160 are coupled to a second read bitline RBL1b. Separating the bitlines (BL0, BL1) into read and write bitlines (RBL0b, RBL1b, WBL0, WBL1) allows read operations to be performed faster than a memory cell with a single port cell since capacitance loading of the write transistors 130, 132, 150, 152 is removed from the read bitlines RBL0, RBL1. A further advantage of this memory device 400 is that the read bitlines are independent of the write bitlines so concurrent reads and writes within a block of memory cells can be supported.

Figure 5:
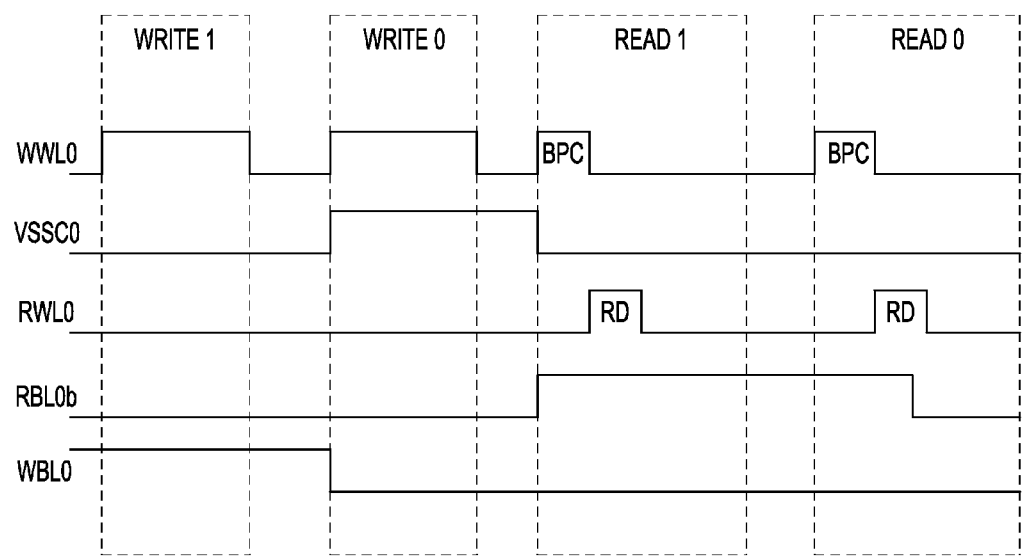
FIG. 5 is a timing diagram showing states of signals in a memory cell that may be used in the memory array of FIG. 4 during write, pre-charge and read operations in accordance with one embodiment.

FIG. 5 is a timing diagram showing states of signals in a memory cell that may be used in the memory array of FIG. 4 during write, pre-charge and read operations in accordance with one embodiment. Note that while write "1", write "0", read "1", and read "0" states are shown as starting immediately after the previous state ends, it is likely some time will pass between states and the various signals VSSC0, WWL0, RWL0, RBL0b, and WBL0, may take different intermediate values during time intervals between states that are not shown in FIG. 5.

Referring to FIGS. 5 and 4, to write a "1" in a selected memory cell 406, FIG. 5 shows the write bitline WBL0 taken to a supply voltage, for example, 2 Volts, write wordline WWL0 is turned on, and VSSC0 is grounded. This will switch resistive element 136 from HRS to LRS.

To write a "0" in a selected memory cell 406, the write bit line WBL0 is taken to ground. Write wordline WWL0 is turned on, and VSSC0 is taken to a supply voltage, such as 2 Volts, which will switch resistive element 136 from LRS to HRS. The data storage state is determined by the state (HRS or LRS) of resistive element 136. Typically, HRS is about two to more than ten times higher than LRS.

To read memory cell 406, VSSC0 is set to zero Volts, and RBL0b is first precharged to a positive voltage. During the precharge portion in which WWL0 is asserted, transistor 132 is on and current is provided from WBL0 to internal node A which precharges node A to a high voltage. After the precharge is complete, WWL0 is deasserted thus turning off transistor 132, and the read wordline RWL0 is asserted. Transistor 138 will therefore discharge or not discharge read bitline RBL0 based on the resistive state of resistive element 136.

For example, in the case that a "1" is stored in memory cell 406 (corresponding to resistive element 136 being in a LRS), upon turning on transistor 140 by asserting RWL0, the low resistance of resistive element 136 quickly pulls the control electrode of transistor 138 low, thus turning off transistor 138. With transistor 138 off, RBL0b is not discharged and remains at a relatively high voltage. This will be sensed by sense amplifier 116 to determine that a "1" is stored in memory cell 406.

In the case that a "0" is stored in memory cell 406 (corresponding to resistive element 136 being in a HRS), upon turning on transistor 140 by asserting RWL0, the high resistance of resistive element 136 draws relatively little current. Therefore, transistor 138 is left on and discharges RBL0b which pulls RBL0 low or to ground, as illustrated in FIG. 5. This will be sensed by sense amplifier 116 to determine that a "0" is stored in memory cell 406.

Figure 6:
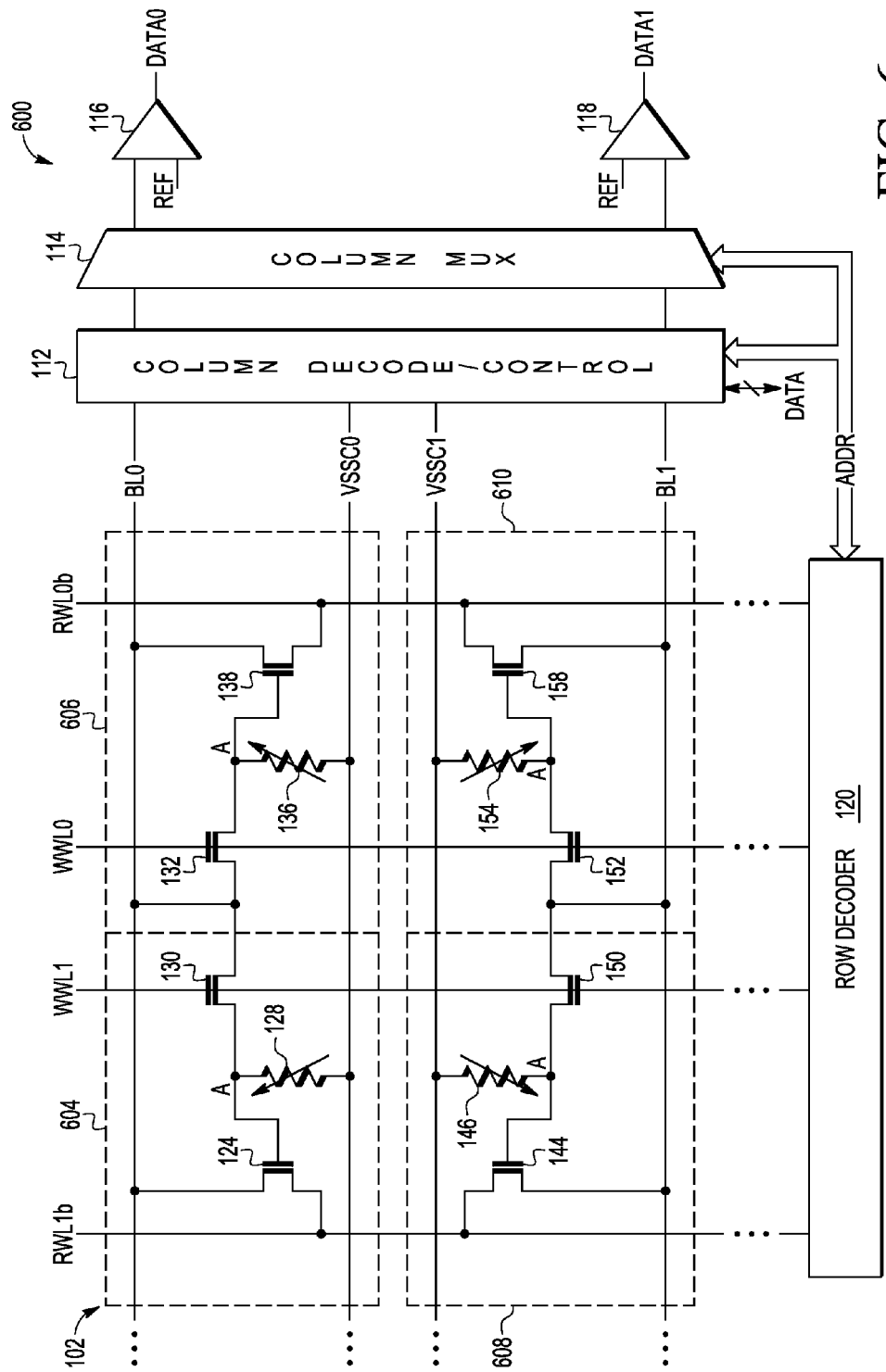
FIG. 6 is a schematic diagram of an integrated circuit device including a single port non-volatile memory (NVM) according to yet another embodiment.

Referring now to FIG. 6, integrated circuit or memory device 600 is shown with memory cells 604-610 having a structure and function that is similar to memory cells 104-110 shown in and described for FIG. 1 with the exception that transistors 122, 140, 142 and 160 shown in FIG. 1 are removed. The first current electrodes of transistors 124, 138, 144 and 158 are now connected directly to respective bitlines BL0 and BL1 and the second current electrodes of transistors 124, 138, 144 and 158 are now connected to respective complementary read wordlines RWL0b and RWL1b.

The timing diagram of FIG. 3 also applies to the memory array of FIG. 6 except that RWL0 is inverted to become RWL0b.

Referring to FIGS. 3 and 6, to write a "1" in a selected memory cell 606, FIG. 3 shows that bitline BL0 is taken to a supply voltage, for example, 2 Volts. The write wordline WWL0 is turned on, and VSSC0 is grounded. This will switch resistive element 136 from HRS to LRS.

To write a "0" in a selected memory cell 606, bitline BL0 is taken low, for example, to 0 Volts. Write wordline WWL0 is turned on, and VSSC0 is taken to supply voltage, for example, 2 Volts. This results in a current flowing from VSSC0 through resistive element 136 to internal node A, which switches resistive element 136 from LRS to HRS.

To read memory cell 606, VSSC0 is set to zero volts, and BL0 is set to a positive voltage. For the precharge portion (labeled BPC) of the read operation, write wordline WWL0 and BL0 are asserted to logic level highs (for example, two volts). During the precharge portion in which WWL0 is asserted, transistor 132 is on and current is provided form BL0 to internal node A which precharges node A to a high voltage. After the precharge is complete, WWL0 is deasserted thus turning off transistor 132. In order to perform the read, bitline BL0 is precharged to a positive voltage and RWL0b is asserted. When RWL0b is asserted, based on the resistive state of resistive element 136, node A will discharge slowly (HRS) or very quickly (LRS) and as a result, transistor 138 will discharge bitline BL0 a greater or lesser amount, respectively.

Notably, the layout area requirements for cells 104-110, 404-410, and 604-610 are comparable to the area required for conventional SRAM cells while providing comparable speed. In addition, the bidirectional resistance memory element of these cells is nonvolatile and immune to soft errors. These memory cells can be used in extremely low power modes since the resistive elements 128, 136, 148 and 156 retain the data while not powered, and thus do not draw leakage current.

By now it should be appreciated that memory cells may utilize a single bi-directional resistive element which can be changed between a high resistive state (HRS) and a low resistive state (LRS), to produce a robust zero or one logic state to be sensed. The memory cells include a resistive element coupled between an internal node and a column-wise power supply (VSSC). The resistive element can be 'programmed' to HRS or to LRS, depending on the desired logic state to be stored. The cells also include a write transistor coupled between a bitline and the internal node and controlled by a write wordline, and a two-transistor read circuit actuated by a read wordline, coupling the read circuit to the bitline. The write transistor is used to provide a current to program the resistive element to a HRS or a LRS for a write operation and to precharge the internal node in preparation for a read operation. The two-transistor read circuit either does or does not discharge the bit line, based on the state of the resistive element.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the scope of the disclosure as defined by the appended claims.

In accordance with one embodiment, a memory cell includes a single bi-directional resistive memory element (BRME) having a first terminal directly connected to a first power rail and a second terminal coupled to an internal node; and a first transistor having a control electrode coupled to the internal node, and a first current electrode coupled to a first bitline, and a second current electrode coupled to one of a group consisting of: a read wordline and the first power rail. In one aspect of the above embodiment, the memory cell further includes a second transistor having a control electrode coupled to a write wordline, a first current electrode coupled to the first or a second bitline, and a second current electrode coupled to the internal node. In a further aspect, the first bitline and the second bitline are a same bitline. In another aspect of the above embodiment, the memory cell further includes a second transistor having a first current electrode coupled to the first bitline, a second current electrode coupled to the first current electrode of the first transistor, and a control electrode coupled to the read wordline. In a further aspect, the memory cell further includes a third transistor having a first current electrode coupled to the first or a second bitline, a control electrode coupled to a write wordline, and a second current electrode coupled to the internal node. In another aspect of the above embodiment, during a read operation, the internal node is precharged to a specified voltage. In another aspect of the above embodiment, during a read operation, the first transistor draws a current from the first bitline based on a resistive state of the BRME. In a further aspect, during a write operation, the third transistor couples the first or second bitline to the internal node, when a voltage at the internal node is at least a predetermined amount greater than a voltage at the first power rail, a first logic state is written to the memory cell, and when the voltage at the internal node is at least the predetermined amount less than the voltage of the first power rail, a second logic state is written to the memory cell. In another aspect of the above embodiment, during a read operation with the second current electrode of the first transistor coupled to the read wordline, one of a group consisting of: (1) the first bitline is precharged high and the read wordline is active low, and (2) the first bitline is pulled low and the read wordline is active high.

In accordance with another embodiment, a method of operating a memory cell having only one bi-directional resistive element that includes a first terminal directly connected to a first power rail and a second terminal coupled to an internal node includes during a read operation: coupling the internal node to a first bitline to precharge the internal node, and drawing current through a pull-down transistor based on a resistive state of the resistive element, wherein a control electrode of the pull-down transistor is coupled to the internal node; and during a write operation to place the resistive element in a first resistive state: biasing voltages at the first bitline and at the first power rail such that current flows in a first direction through the resistive element. In one aspect, during the write operation, the write wordline voltage is approximately the same as the first voltage. In another aspect, the method further includes during another write operation to place the resistive element in a second resistive state, biasing voltages at the first bitline and at the first power rail such that current flows in a second direction through the resistive element. In another aspect, the method further includes, during the write operation, reading the memory cell by sensing current on a read bitline coupled to the pull-down transistor. In another respect, the method further includes biasing the first bitline high to precharge the internal node. In another aspect, the method further includes, during the read operation, sensing the first bitline to determine a logic state stored in the memory cell, wherein current sensed on the first bitline is based on current through the pull-down transistor.

In yet another embodiment, a memory includes an array of memory cells, wherein each memory cell includes: a read wordline, a write wordline, a single bi-directional resistive element having a first terminal directly connected to a first power rail and an second terminal coupled to an internal node, and a first transistor having a control electrode coupled to the internal node, a first current electrode coupled to a first bitline, and a second current electrode coupled to one of a group consisting of: the read wordline and the first power rail; column decode and sense circuitry coupled to the first bitline of each memory cell of the array of memory cells; and row decode circuitry coupled to the read wordline and the write wordline of each memory cell of the array of memory cells. In one aspect of the above yet another embodiment, during a read operation, the internal node is precharged to a specified voltage. In another aspect, during a read operation, for each memory cell coupled to an activated read wordline, the first transistor is configured to draw current from the first bitline based on one of a group consisting of a high resistive state and a low resistive state of the bi-directional resistive element, wherein for each memory cell of the array of memory of cells, when the bi-directional resistive element has a high resistance, the memory cell stores a first logic state, and when the bi-directional resistive element has a low resistance, the memory cell stores a second logic state. In another aspect, the memory further includes a pass transistor having a control electrode coupled to the write wordline, a first current electrode coupled to the first bitline or a second bitline, and a second current electrode coupled to the internal node, wherein during a write operation, for each memory cell coupled to an activated write wordline, the pass transistor couples the first or second bitline to the internal node, and when a voltage at the internal node is at least a predetermined amount greater than a voltage of the power rail, a first logic state is written to the memory cell and when the voltage at the internal node is at least the predetermined amount less than the voltage of the power rail, a second logic state is written to the memory cell. In a further aspect, in each memory cell of the memory array of memory cells, the first bitline and the second bitline are a same bitline.

What is claimed is:

1. A memory cell comprising:
   a single bi-directional resistive memory element (BRME) having a first terminal directly connected to a first power rail and a second terminal coupled to an internal node;
   a first transistor having a control electrode coupled to the internal node, and a first current electrode coupled to a first bitline, and a second current electrode coupled to one of a group consisting of: a read wordline and the first power rail; and
   a second transistor having a control electrode coupled to a write wordline, a first current electrode coupled to the first or a second bitline, and a second current electrode coupled to the internal node, wherein the first bitline and the second bitline are a same bitline.

2. The memory cell of claim 1, further comprising:
   a third transistor having a first current electrode coupled to the first bitline, a second current electrode coupled to the first current electrode of the first transistor, and a control electrode coupled to the read wordline.

3. The memory cell of claim 1, wherein, during a read operation, the internal node is precharged to a specified voltage.

4. The memory cell of claim 1, wherein, during a read operation, the first transistor draws a current from the first bitline based on a resistive state of the BRME.

5. The memory cell of claim 2, wherein during a write operation,
   the second transistor couples the first or second bitline to the internal node,
   when a voltage at the internal node is at least a predetermined amount greater than a voltage at the first power rail, a first logic state is written to the memory cell, and
   when the voltage at the internal node is at least the predetermined amount less than the voltage of the first power rail, a second logic state is written to the memory cell.

6. The memory cell of claim 1, wherein, during a read operation with the second current electrode of the first transistor coupled to the read wordline, one of a group consisting of: (1) the first bitline is precharged high and the read wordline is active low, and (2) the first bitline is pulled low and the read wordline is active high.

7. A method of operating a memory cell having only one bi-directional resistive element that includes a first terminal directly connected to a first power rail and a second terminal coupled to an internal node, the method comprising:
   during a read operation:
      coupling the internal node to a first bitline to precharge the internal node, and
      drawing current through a pull-down transistor based on a resistive state of the resistive element, wherein a control electrode of the pull-down transistor is coupled to the internal node; and
   during a write operation to place the resistive element in a first resistive state:
      biasing voltages at the first bitline and at the first power rail such that current flows in a first direction through the resistive element.

8. The method of claim 7, wherein, during the write operation, the write wordline is active high.

9. The method of claim 7, further comprising, during another write operation to place the resistive element in a second resistive state, biasing voltages at the first bitline and at the first power rail such that current flows in a second direction through the resistive element.

10. The method of claim 7, further comprising: during the write operation, reading the memory cell by sensing current on a read bitline coupled to the pull-down transistor.

11. The method of claim 7, further comprising:
biasing the first bitline high to precharge the internal node.

12. The method of claim 7, further comprising, during the read operation, sensing the first bitline to determine a logic state stored in the memory cell, wherein current sensed on the first bitline is based on current through the pull-down transistor.

13. A memory comprising:
an array of memory cells, wherein each memory cell comprises:
a read wordline,
a write wordline,
a single bi-directional resistive element having a first terminal directly connected to a first power rail and an second terminal coupled to an internal node,
a first transistor having a control electrode coupled to the internal node, a first current electrode coupled to a first bitline, and a second current electrode coupled to one of a group consisting of: the read wordline and the first power rail; and
a pass transistor having a control electrode coupled to the write wordline, a first current electrode coupled to the first bitline, and a second current electrode coupled to the internal node
column decode and sense circuitry coupled to the first bitline of each memory cell of the array of memory cells; and
row decode circuitry coupled to the read wordline and the write wordline of each memory cell of the array of memory cells.

14. The memory of claim 13, wherein during a read operation, the internal node is precharged to a specified voltage.

15. The memory of claim 13, wherein, during a read operation, for each memory cell coupled to an activated read wordline, the first transistor is configured to draw current from the first bitline based on one of a group consisting of a high resistive state and a low resistive state of the bi-directional resistive element, wherein for each memory cell of the array of memory of cells, when the bi-directional resistive element has a high resistance, the memory cell stores a first logic state, and when the bi-directional resistive element has a low resistance, the memory cell stores a second logic state.

16. The memory of claim 13, further comprising:
wherein during a write operation,
for each memory cell coupled to an activated write wordline, the pass transistor couples the first bitline to the internal node, and
when a voltage at the internal node is at least a predetermined amount greater than a voltage of the power rail, a first logic state is written to the memory cell and when the voltage at the internal node is at least the predetermined amount less than the voltage of the power rail, a second logic state is written to the memory cell.

* * * * *